(12) United States Patent
Albrecht

(10) Patent No.: US 8,602,708 B2
(45) Date of Patent: Dec. 10, 2013

(54) LOCK DEVICE FOR ADDING AND REMOVING CONTAINERS TO AND FROM A VACUUM TREATMENT CHAMBER

(75) Inventor: Thomas Albrecht, Beilngries (DE)

(73) Assignee: Krones AG, Neutraubling (DE)

( * ) Notice: Subject to any disclaimer, the term of this patent is extended or adjusted under 35 U.S.C. 154(b) by 154 days.

(21) Appl. No.: 12/865,417

(22) PCT Filed: Dec. 18, 2008

(86) PCT No.: PCT/EP2008/010848
§ 371 (c)(1),
(2), (4) Date: Oct. 6, 2010

(87) PCT Pub. No.: WO2009/097888
PCT Pub. Date: Aug. 13, 2009

(65) Prior Publication Data
US 2011/0033267 A1 Feb. 10, 2011

(30) Foreign Application Priority Data
Feb. 4, 2008 (DE) .......................... 10 2008 007 629

(51) Int. Cl.
*B65G 53/46* (2006.01)
(52) U.S. Cl.
USPC ..................................... 414/220; 198/803.3

(58) Field of Classification Search
USPC ........................ 414/217, 219–220; 198/803.3
See application file for complete search history.

(56) References Cited

U.S. PATENT DOCUMENTS

| 6,196,154 B1 * | 3/2001 | Baumecker et al. ..... 118/723 VE |
| 7,513,953 B1 * | 4/2009 | Felts .............................. 118/719 |
| 2004/0091650 A1 * | 5/2004 | Krempel-Hesse et al. .. 428/35.7 |

FOREIGN PATENT DOCUMENTS

| DE | 2747061 A1 | 4/1979 |
| DE | 2840949 A1 | 12/1979 |
| EP | 0943699 A1 | 9/1999 |
| EP | 1577419 A1 | 9/2005 |
| FR | 2106858 A5 | 5/1972 |
| GB | 1565521 A | 4/1980 |
| GB | 1604556 A | 12/1981 |
| GB | 2143910 A | 2/1985 |
| JP | 58009241 A | 1/1983 |

* cited by examiner

*Primary Examiner* — Jonathan Snelting
(74) *Attorney, Agent, or Firm* — Marshall, Gerstein & Borun LLP

(57) ABSTRACT

A lock device for adding and removing containers to and from a vacuum treatment chamber includes carrier plates for the containers. The carrier plates are fastened to revolving transport chains and are transported through lock channels provided in straight sections along the transport chains. The carrier plates also achieve a sealing effect with the channels as they are moved past suction or ventilation openings in the lock channels to form a differential pressure stage.

10 Claims, 3 Drawing Sheets

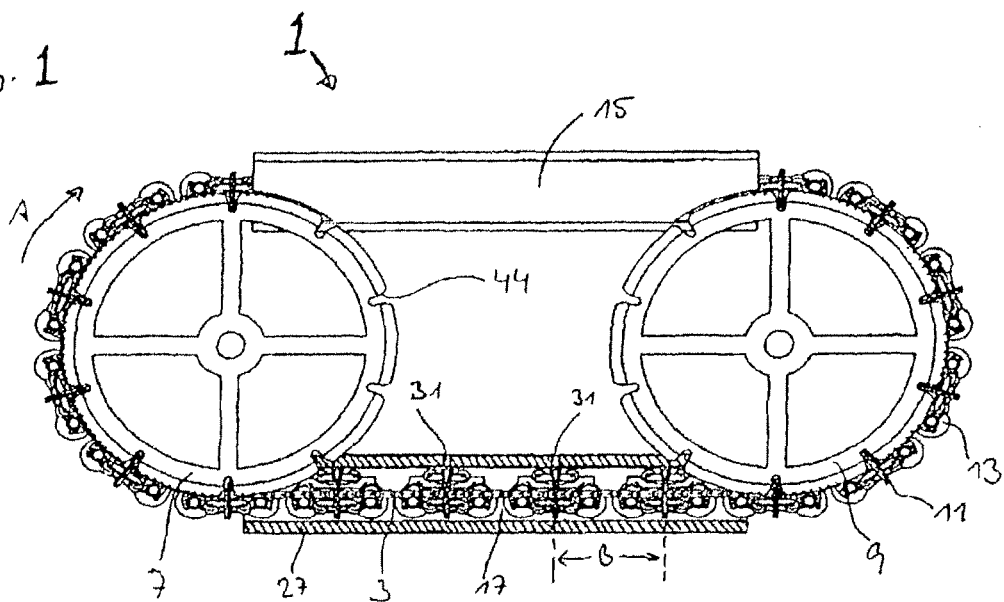
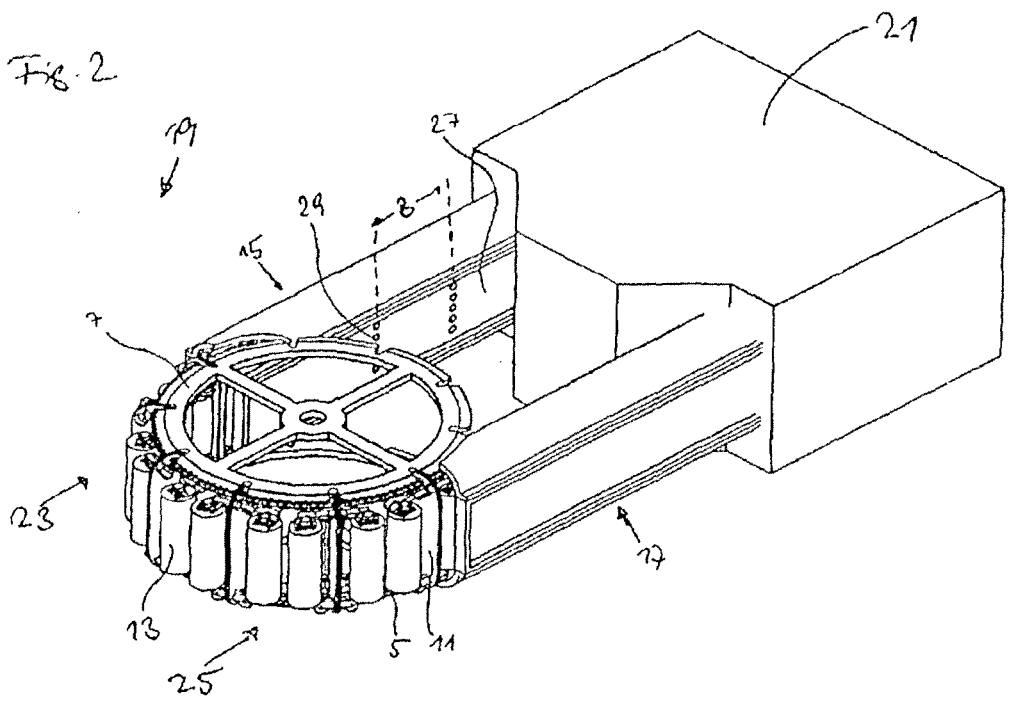

LOCK DEVICE FOR ADDING AND REMOVING CONTAINERS TO AND FROM A VACUUM TREATMENT CHAMBER

CROSS-REFERENCE TO RELATED APPLICATION

The present application claims the benefit of priority of International Patent Application No. PCT/EP2008/010848, filed Dec. 18, 2008, which application claims priority of German Application No. 102008007629.5, filed Feb. 4, 2008. The entire text of the priority application is incorporated herein by reference in its entirety.

FIELD OF THE DISCLOSURE

The disclosure relates to a lock device for continuously adding and removing containers to and from a vacuum treatment chamber.

BACKGROUND

Such lock devices are required e.g. for vacuum-supported coating processes, e.g. to increase gas-tightness of PET bottles which to this end are usually treated in a vacuum of about 10 to 40 mbar. For this, continuous locking in and out is indispensible for an economical manufacturing process.

A generic lock device is known e.g. from EP 0943699 B1. This lock comprises a revolving housing with a lock chamber wheel rotatably mounted therein in which lock chambers with openings for loading and unloading containers to be locked are provided on the circumference.

The revolving housing comprises suction pipes for evacuating the lock chambers which are atmospherically sealed from each other by circumferential seals on the lock wheel. The lock chambers between the charging and the discharging station, respectively, in the outer room and the evacuated treatment room form a differential pressure stage, the lock chamber pressure being reduced revolving in the direction of the treatment room, from the atmospheric pressure usually prevailing in the outer room to the pressure prevailing in the treatment room.

However, due to the complicated manufacture of the revolving housing and the lock chamber wheel, a subsequent adaptation of the device to different container sizes and shapes is expensive or not possible at all. To be able to also for large containers provide sufficiently large lock chambers in a number sufficient for the differential pressure stage, it is moreover necessary to correspondingly increase the diameter of the lock wheel. This involves a wide structural shape which might be undesired.

Another lock device known from DE 27 47 061 A is used to lock tapes into or out of a vacuum coating chamber through a pressure stage section. The lock device comprises several fixed lock chambers arranged one behind the other and separated from each other with slit-like diaphragms. The tape to be coated is transported through the slit diaphragms and the lock chambers on a backing tape. To be able to generate a drop of pressure between the chambers, the diaphragms must be adapted to the cross-section of the backing tape and the tape to be coated. Such a device, however, is not practicable for locking in and out containers, as these, in contrast to a tape, do not comprise a constant cross-section seen in the moving direction, or as gaps between the individual bottles are inevitable.

SUMMARY OF THE DISCLOSURE

It is an aspect of the present disclosure to provide a generic lock device which permits continuous adding and removing of containers to and from a vacuum coating room into a room with atmospheric pressure, which, however, does not comprise the aforementioned disadvantageous restrictions.

This aspect is achieved with the present lock device. Accordingly, the lock comprises a revolving transport means comprising straight sections with carrier plates arranged at the transport means at distances for holding the containers, with lock channels at least partially extending along the straight sections through which the containers are transported by transport means, the carrier plates being embodied so that they achieve such a sealing effect with the channel walls that a drop of pressure can be generated in the lock channels.

The lock device can be flexibly and inexpensively adapted to changed demands by exchanging the carrier plates and/or changing the distance between the carrier plates.

Advantageously, a suction opening or a ventilation opening is embodied in the channel wall. Thereby, the lock channel can be evacuated or ventilated without having to provide disturbing conduits in the channel.

In one advantageous embodiment, the carrier plates are, at least in sections, thicker than the clearance of the suction opening or the ventilation opening at the side facing the suction opening or the ventilation opening, so that the opening can be closed by the carrier plates. Thus, pressure compensation in the lock channel can be timed.

In the moving direction of the transport means, further suction openings or ventilation openings are preferably arranged at a distance. This permits suction or ventilation with different pressures section by section.

It is particularly advantageous to be able to generate step-like pressure differences between the front and rear sides of the carrier plates. This permits to displace regions of different pressures within the lock channel with the carrier plates.

Favorably, the lock channel is embodied as differential pressure stage in which the pressure is reduced towards the vacuum treatment chamber. Thereby, the bottles can be step-wise adapted to the vacuum in the treatment chamber.

In a particularly advantageous embodiment, the carrier plates each comprise at least one seal surrounding the edge and lying against the channel wall. Thereby, the sealing effect of the carrier plates can be improved.

It is furthermore advantageous to embody the transport means in the form of two chains, toothed racks, tension bars or belts arranged one upon the other. This permits uniform power transmission to the carrier plates and prevents the plates from being inclined in the lock channel.

In a particularly advantageous embodiment, the carrier plates comprise rollers which support the plates at the channel wall. It is thereby prevented that the plates are tilted or get jammed. Moreover, the rollers take care that the plates maintain an essentially constant distance to the channel wall over the complete circumference and a uniform sealing effect is thus achieved.

Favorably, the carrier plates are centrically fixed to the transport means. Thereby, a moment on the support rollers can be prevented.

Advantageously, the channel wall comprises plate-like lateral segments which are connected by half bowls. This permits a good sealing effect as well as an inexpensive manufacture and adaptation to different bottle sizes.

BRIEF DESCRIPTION OF THE DRAWINGS

The disclosure will be described more in detail below with reference to a preferred embodiment represented in the figures. In the drawings:

FIG. 1 shows a plan view of a preferred lock device according to the disclosure;

FIG. 2 shows a diagonal view of the lock device of FIG. 1 with an adjacent treatment chamber;

DETAILED DESCRIPTION OF THE PREFERRED EMBODIMENT

Figure 3:
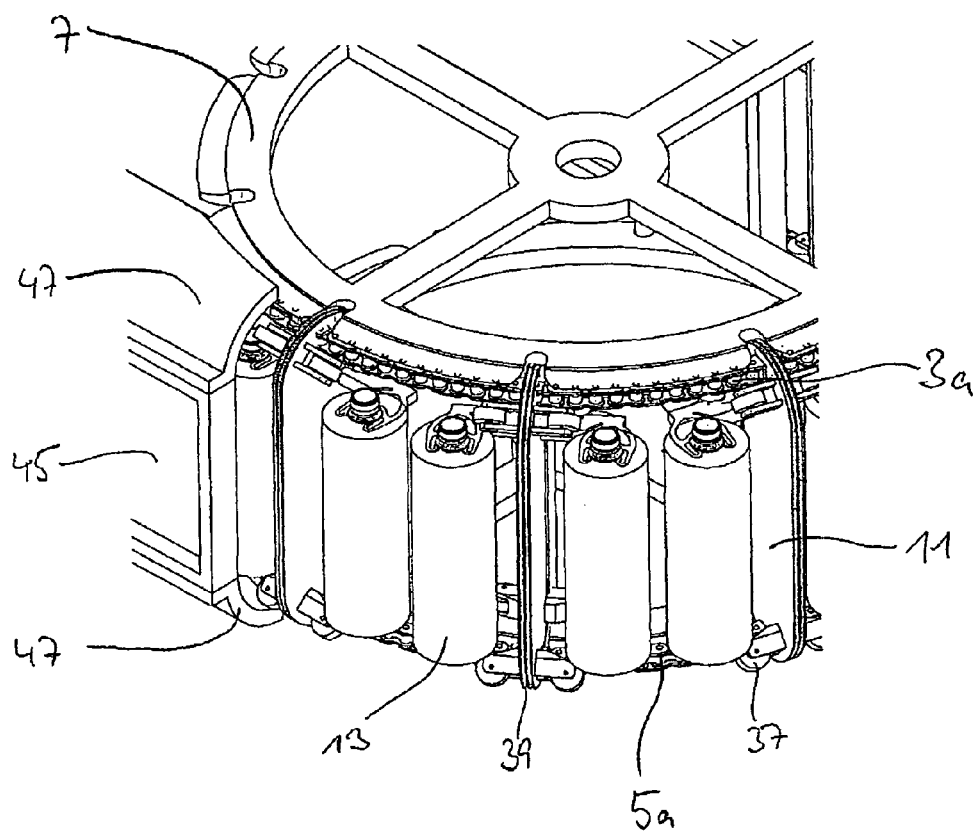
FIG. 3 shows a detailed view of the lock device of FIG. 1.

The lock device according to the disclosure represented in FIG. 1 comprises a transport means in the form of two chains 3, 5 arranged one upon the other (in FIG. 1, only the upper chain 3 is represented), which move around two chain wheels 7, 9 in the direction of the arrow A and at which carrier plates 11 for holding bottles 13 to be treated are provided at regular distances B in an essentially orthogonal position to the moving direction. Most of the straight sections of the chains 3, 5 extend through lock channels 15, 17.

According to FIG. 2, the chain wheel 7 is located in an outer room 19 at normal atmospheric pressure, while the chain wheel 9 (not represented in FIG. 2) is arranged in an evacuated treatment chamber 21. The bottles 13 are supplied in a charging region 23 and removed again in a discharging region 25 (charging and discharging are not represented).

In the wall 27 of the lock channel 15, suction openings 29 are provided at a distance B to which suited pumps, e.g. vacuum pumps (not represented) are connected, so that the respective applied pressure p is reduced in the moving direction A.

According to FIG. 1, also at a distance B, ventilation openings 31 are provided in the wall 27 of the lock channel 17. Suited pumps can be connected to these, so that the respective applied pressure p is increased in the moving direction A. However, it is also possible to passively ventilate the lock channel 17 through the ventilation openings 31, e.g. via suitably dimensioned connections (not represented) to the outer room 19 or via a short circuit to the inlet channel 15 to recycle the vacuum.

Figure 4:
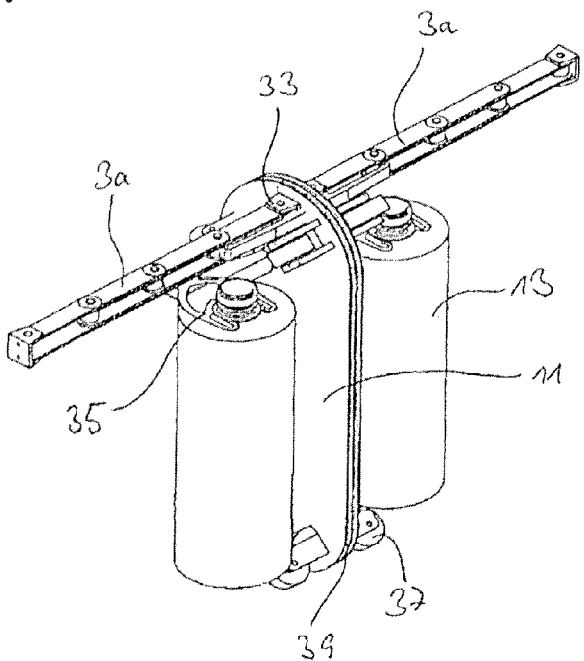
FIG. 4 shows a diagonal view of a carrier plate with chain segments and bottles.

As can be taken from FIGS. 3 and 4, the chains 3, 5 consist of chain segments 3a, 5a, of which the ends are each centrically attached to the carrier plates 11. To this end, one chain connection link 33 each is provided at the front sides (facing the moving direction A) and rear sides of the carrier plates 11.

Figure 5:
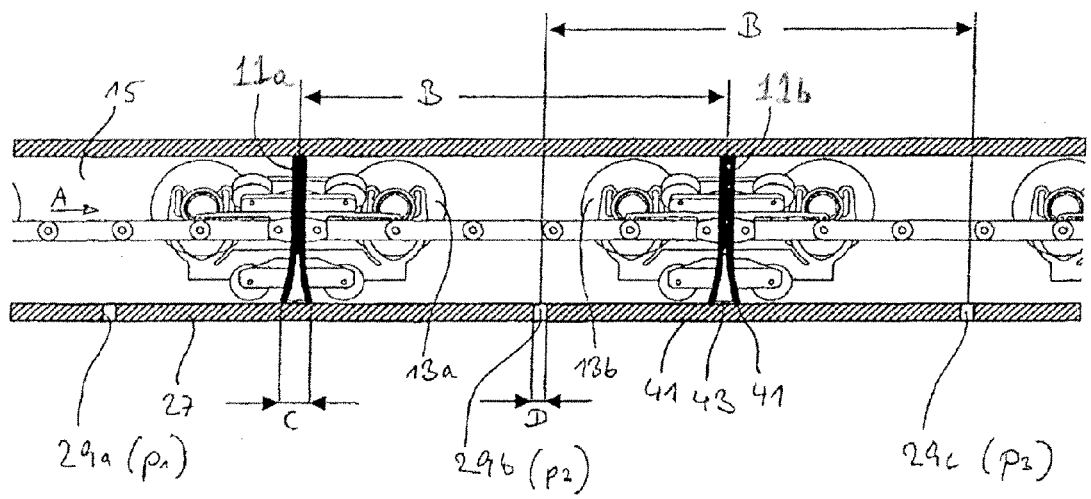
FIG. 5 shows a schematic section in the plan view through a differential pressure lock according to the disclosure.

Each carrier plate 11 comprises one clamp 35 each for holding the bottles 11 on the plate front side and on the plate rear side, as well as rollers 37 that support the carrier plates at the walls 27 of the lock channels 15, 17. The carrier plate 11 furthermore comprises two surrounding grooves 39 which, as shown in FIG. 5, receive each one seal 41 lying against the channel wall. The distance between the grooves 41 is enlarged on the side of the carrier plate 11 facing the suction openings 29 or ventilation openings 31, respectively. Thereby, a sealing region 43 is provided at the carrier plate 11 of which the length C (in the moving direction A) is larger than the clearance D of the suction opening 29 or the ventilation opening 31 (in FIG. 5, suction openings are shown by way of example).

The chain segments 3a, 5a are preferably embodied as roller chains. Chain segments 3a, 5a of a uniform length can be easily manufactured with them and fixed by means of the chain connection links 33. However, it is just as well possible to embody a transport means according to the disclosure on the basis of toothed racks, tension bars or belts.

The chain wheel 7 is preferably mounted to be movable. In this manner, the tension of the chains 3, 5 can be adjusted. Grooves 44 into which the carrier plates 11 engage are provided at the circumference of the chain wheels 7, 9, at a distance B. The chain wheels 7, 9 can moreover engage in the links of the chains 3, 5. If toothed racks are used instead of the chains 3, 5, they can be driven by means of toothed wheels.

The lock channels 15, 17 each comprise two rectangular plates 45 which are bolted with two half bowls 47 with a semicircular cross-section. This permits a flexible, modular assembly. The resulting channel cross-section moreover permits a good sealing effect of the carrier plates 11. The lock channels 15, 17, however, could also have a different cross-section and/or be composed of a different number of individual parts or made of one piece, respectively. The lock channels 15, 17 are preferably made of metal, in particular of hardenable steel.

The suction openings 29 of the lock channel 17 are preferably embodied as borings, but they can also have another, e.g. rectangular cross-section. In FIG. 2, five suction openings 29 each are arranged one upon the other. However, a different number is also possible. It is decisive that all suction openings 29 can be simultaneously closed by the sealing region 43 of the carrier plate 11. This is also true for the ventilation openings 31 of the lock channel 19, i.e. the suction openings 29 and the ventilation openings 31 are arranged and shaped such that the carrier plates 11 drive over them simultaneously and close them in the process.

In FIG. 2, two groups of five suction openings 29 each are represented in the moving direction A. As is illustrated in detail in the functional description, these groups correspond to two differential pressure stages, like the two ventilation openings 31 shown in FIG. 1. The number of differential pressure stages, however, can be different, as is shown in FIG. 5. Equally, the number of pressure stages on the suction side and on the ventilation side can differ.

In the embodiment represented in the figures, the pressure stages are based on the suction or ventilation through the openings 29, 31 in the channel wall 27. As an alternative, however, it is also conceivable to replace the openings 29, 31 by an internal suction or ventilation in the lock channels 15, 17, e.g. by suited conduits in the lock channels 15, 17 and/or in the channel wall 27.

The carrier plates 11 are preferably made of metal, such as special steel or aluminum, or of plastics, and their shape is adapted to the cross-section of the lock channels 15, 17, such that a uniform sealing effect is achieved by the seals 41 or a sealing gap (not represented).

The seals 41 are embodied as lip seals. The number of seals, however, can deviate from the shown embodiment upwards or downwards. As an alternative, other sealing means could be also used, or the carrier plates 11 could be adapted to the cross-section of the lock channels 15, 17 so precisely, that a sufficient sealing effect, including the sealing region 43, is also achieved without the seals 41, e.g. with a sealing gap.

The carrier plates 11 are supported in the lock channels 15, 17 by the rollers 37, such that the plates 11 do not tilt or get jammed and the plates 11 maintain an essentially uniform distance to the channel wall 27 over the complete circumference to achieve a uniform sealing effect e.g. with a uniform sealing gap in this manner. The represented number and position of the rollers 37 is given by way of example and depend, among other things, on the position of the suction openings 29. Outside the lock channels 15, 17, the carrier plates 11 do not have to be guided at the rollers 37.

The chain connection links 33 are arranged centrically on the carrier plates 11. Thus, the chains 3, 5 centrically act at the carrier plate 11 at the top and bottom to avoid a moment on the support rollers 37. If other drive means are employed, such as e.g. toothed racks, tension bars or belts, the connection links 33 are embodied to match these.

The clamps 35 are arranged such that the bottles 13 are held between the upper chain 3 and the lower chain 5.

Below, the functioning of the lock device shown in the embodiment will be illustrated with reference to the adjacent bottles 13a, 13b shown in FIG. 5. Here, "adjacent" bottles means that these are subjected to essentially the same pressure in the lock channel and are separated from "non-adjacent" bottles with the carrier plates 11a, 11b by a drop of pressure.

The chains 3, 5 are driven continuously, e.g. by a motor acting on the chain wheel 7 (not represented). At each of the suction openings 29a, 29b, 29c, a vacuum p1, p2, p3 is continuously applied, where p1>p2>p3.

The bottles 13a, 13b to be treated are handed over to the clamps 35 of the carrier plates 11a, 11b with a suited charging station (e.g. a common star wheel) in the region 23 and transferred into the lock channel 15 on the inlet side. There, the bottles 13a, 13b are first under normal atmospheric pressure. As soon as the front plate 11b passes the first suction opening 29a, the region between the plates 11a and 11b is in communication with the suction opening 29a and is evacuated maximally to a suction pressure p1, while the chain transport is simultaneously continued. This evacuation step is continued until the rear plate 11a drives over the first suction opening 29a and closes the same thereby. As the carrier plates 11 and the suction openings 29 are essentially arranged at the same distance B with respect to each other, the front plate 11b simultaneously drives over the second suction opening 29b.

As soon as the front plate 11b now passes the second suction opening 29b, the region between the plates 11a and 11b is in communication with the suction opening 29b and will be evacuated maximally to the suction pressure p2, until the rear plate 11a drives over the second suction opening 29b and closes the same thereby. Thus, the region between the plates 11a and 11b is evacuated in two stages to this point in time, and thus a differential pressure stage is realized.

This procedure can be repeated by driving over further suction openings 29 at a lower pressure, e.g. the third suction opening 29c shown in FIG. 5, until the pressure in the region between the plates 11a and 11b is lowered to the desired pressure level, e.g. that of the treatment chamber 21.

Subsequently, the bottles enter the vacuum chamber 21, are treated there (e.g. coated while plasma is generated) and then reach the lock channel 17 on the exit side. There, the pressure between the plates 11a and 11b is gradually increased again by driving over the ventilation openings 31. This procedure is analogue to the above-described stepwise evacuation, however with opposite signs.

In contrast to the known revolving lock, the lock according to the disclosure does without any expensive components, such as a chamber rotor complicated to manufacture or the rotor housing. Instead, different differential pressure stages with essentially uniform or standardized components, such as e.g. the carrier plates 11, can be realized and modified, if required, with the disclosure.

The invention claimed is:

1. Lock device for continuously adding and removing containers to and from a vacuum treatment chamber comprising:
    a revolving transport means having straight transport sections;
    carrier plates fixed to the transport means at a distance (B) for holding the containers;
    straight lock channels extending along the straight transport sections through which the containers are transported by the transport means, and
    wherein the carrier plates are embodied such that the carrier plates achieve a sealing effect with a wall of each respective lock channel to ensure that a drop of pressure can be generated in the straight lock channels and stepwise pressure differences can be generated in the straight lock channels between front and rear sides of the carrier plates.

2. Lock device according to claim 1, and one of a suction opening or a ventilation opening is embodied in the wall of each respective straight lock channel.

3. Lock device according to claim 2, wherein the carrier plates are at least in sections thicker at a side facing the suction opening or the ventilation opening than a clearance (D) of the suction opening or the ventilation opening, so that the respective opening is temporarily closed by the carrier plates while the carrier plates are transported past the respective opening.

4. Lock device according to claim 2, and further suction openings or ventilation openings arranged at a distance (B) are embodied in the respective straight lock channels in a moving direction of the transport means.

5. Lock device according to claim 1, wherein the straight lock channels are embodied as differential pressure stages in which the pressure is reduced towards the vacuum treatment chamber.

6. Lock device according to claim 1, wherein the carrier plates each comprise at least one surrounding seal which lies against the wall of the respective straight lock channel.

7. Lock device according to claim 1, wherein the transport means is embodied in the form of two chains, or two belts arranged one upon the other.

8. Lock device according to claim 1, wherein the carrier plates comprise rollers which support the carrier plates at the wall of the respective straight lock channel.

9. Lock device according to claim 1, wherein the carrier plates are centrically fixed to the transport means.

10. Lock device according to claim 1, wherein the wall of each of the straight lock channels comprises plate-like lateral segments which are connected by upper and lower half bowls.

* * * * *